US010950551B2

(12) United States Patent
Liao et al.

(10) Patent No.: US 10,950,551 B2
(45) Date of Patent: Mar. 16, 2021

(54) EMBEDDED COMPONENT PACKAGE STRUCTURE AND MANUFACTURING METHOD THEREOF (71) Applicant: ADVANCED SEMICONDUCTOR ENGINEERING, INC., Kaohsiung (TW)

(72) Inventors: Yu-Ju Liao, Kaohsiung (TW); Chien-Fan Chen, Kaohsiung (TW); Chien-Hao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/397,539

(22) Filed: Apr. 29, 2019

(65) Prior Publication Data

US 2020/0343188 A1 Oct. 29, 2020

(51) Int. Cl.
*H01L 23/538* (2006.01)
*H01L 21/48* (2006.01)
*H05K 3/46* (2006.01)
*H01L 21/67* (2006.01)
*H01L 23/31* (2006.01)

(52) U.S. Cl.
CPC ...... *H01L 23/5384* (2013.01); *H01L 21/4871* (2013.01); *H01L 21/67288* (2013.01); *H01L 23/3107* (2013.01); *H01L 23/5383* (2013.01); *H05K 3/4688* (2013.01)

(58) Field of Classification Search
None
See application file for complete search history.

(56) References Cited

U.S. PATENT DOCUMENTS

| | | | | |
|---|---|---|---|---|
| 6,271,109 B1 * | 8/2001 | Weygan | ................. | H01L 24/11 257/E21.508 |
| 6,562,660 B1 * | 5/2003 | Sakamoto | ........... | H01L 21/4832 438/124 |
| 6,835,580 B1 * | 12/2004 | Knapp | ............. | H01L 23/49562 438/15 |
| 7,633,157 B2 * | 12/2009 | Jiang | ...................... | H01L 23/16 257/724 |
| 8,535,978 B2 | 9/2013 | Scanlan | | |
| 8,569,892 B2 | 10/2013 | Mori et al. | | |

(Continued)

FOREIGN PATENT DOCUMENTS

| | | |
|---|---|---|
| JP | 2015233160 A | 12/2015 |
| JP | 2016-225398 A | 12/2016 |

(Continued)

OTHER PUBLICATIONS

Office Action (with English translation) for corresponding Japanese Patent Application No. 2019-118675, dated Nov. 24, 2020, 11 pages.

*Primary Examiner* — Evren Seven
(74) *Attorney, Agent, or Firm* — Foley & Lardner LLP (57) ABSTRACT An embedded component package structure including a dielectric structure and a component is provided. The component is embedded in the dielectric structure and is provided with a plurality of conductive pillars. The conductive pillars are exposed from an upper surface of the dielectric structure and have a first thickness and a second thickness, respectively, and the first thickness is not equal to the second thickness.

20 Claims, 13 Drawing Sheets

(56) References Cited

U.S. PATENT DOCUMENTS

| | | | |
|---|---|---|---|
| 9,607,968 B1* | 3/2017 | Jeong | H01L 24/73 |
| 10,510,714 B2* | 12/2019 | Tang | H01L 25/16 |
| 2002/0009577 A1 | 1/2002 | Takaya et al. | |
| 2002/0027276 A1* | 3/2002 | Sakamoto | H01L 21/4821 |
| | | | 257/690 |
| 2002/0122934 A1 | 9/2002 | Takaya et al. | |
| 2002/0133943 A1* | 9/2002 | Sakamoto | H01L 24/97 |
| | | | 29/846 |
| 2003/0218263 A1* | 11/2003 | Blaszczak | H01L 21/561 |
| | | | 257/788 |
| 2004/0113719 A1 | 6/2004 | Nakai et al. | |
| 2004/0152426 A1 | 8/2004 | Suzuki et al. | |
| 2004/0233644 A1 | 11/2004 | Ajioka et al. | |
| 2004/0233648 A1 | 11/2004 | Ajioka et al. | |
| 2005/0029642 A1 | 2/2005 | Takaya et al. | |
| 2006/0057341 A1 | 3/2006 | Kawabata et al. | |
| 2007/0057366 A1 | 3/2007 | Katsumata et al. | |
| 2007/0069363 A1 | 3/2007 | Kawabata et al. | |
| 2007/0076320 A1 | 4/2007 | Endo et al. | |
| 2007/0119541 A1 | 5/2007 | Kawabata et al. | |
| 2007/0141759 A1 | 6/2007 | Nagase et al. | |
| 2008/0012154 A1* | 1/2008 | Chang | H01L 24/97 |
| | | | 257/787 |
| 2008/0055859 A1 | 3/2008 | Furukawa et al. | |
| 2008/0149379 A1 | 6/2008 | Nagase et al. | |
| 2008/0202803 A1 | 8/2008 | Nagase et al. | |
| 2008/0211086 A1 | 9/2008 | Morita | |
| 2008/0211143 A1 | 9/2008 | Morita | |
| 2009/0025965 A1 | 1/2009 | Kanemaru et al. | |
| 2009/0025971 A1 | 1/2009 | Kanemaru et al. | |
| 2009/0134490 A1 | 5/2009 | Furukawa et al. | |
| 2009/0211799 A1 | 8/2009 | Nagase et al. | |
| 2009/0218678 A1 | 9/2009 | Kawabata et al. | |
| 2009/0237059 A1 | 9/2009 | Chiba | |
| 2009/0309212 A1* | 12/2009 | Shim | H01L 23/3107 |
| | | | 257/700 |
| 2010/0013103 A1 | 1/2010 | Kawabata et al. | |
| 2010/0051189 A1 | 3/2010 | Kawabata et al. | |
| 2010/0083490 A1 | 4/2010 | Kawabata et al. | |
| 2010/0178737 A1 | 7/2010 | Kawabata et al. | |
| 2010/0246151 A1 | 9/2010 | Furukawa et al. | |
| 2010/0265632 A1 | 10/2010 | Saita et al. | |
| 2011/0234196 A1 | 9/2011 | Chiba | |
| 2012/0044652 A1 | 2/2012 | Horikawa et al. | |
| 2012/0247819 A1 | 10/2012 | Tsuyutani et al. | |
| 2012/0285013 A1 | 11/2012 | Kanemaru et al. | |
| 2014/0085854 A1 | 3/2014 | Tsuyutani et al. | |
| 2014/0104803 A1 | 4/2014 | Tsuyutani | |
| 2014/0225222 A1* | 8/2014 | Yu | H01L 24/97 |
| | | | 257/532 |
| 2014/0333274 A1 | 11/2014 | Abe et al. | |
| 2014/0361427 A1* | 12/2014 | Kim | H01L 25/105 |
| | | | 257/737 |
| 2015/0062809 A1 | 3/2015 | Yokoyama et al. | |
| 2015/0091118 A1* | 4/2015 | Sato | H01L 23/3107 |
| | | | 257/432 |
| 2015/0145145 A1 | 5/2015 | Tsuyutani et al. | |
| 2015/0171028 A1* | 6/2015 | Jo | H01L 23/3128 |
| | | | 257/713 |
| 2015/0348942 A1* | 12/2015 | Kim | H01L 25/0657 |
| | | | 257/773 |
| 2016/0056091 A1* | 2/2016 | Kim | H01L 23/552 |
| | | | 257/368 |
| 2017/0025324 A1 | 1/2017 | Yamaki et al. | |
| 2017/0190572 A1* | 7/2017 | Pan | H05K 999/99 |
| 2017/0295643 A1 | 10/2017 | Suzuki et al. | |
| 2018/0019216 A1* | 1/2018 | Hashemi | H01Q 1/2283 |
| 2018/0027660 A1 | 1/2018 | Yoshida et al. | |
| 2018/0076131 A1* | 3/2018 | Hsu | H01L 24/27 |
| 2018/0132355 A1 | 5/2018 | Saita et al. | |
| 2018/0233553 A1 | 8/2018 | Tomikawa et al. | |
| 2018/0235086 A1 | 8/2018 | Tomikawa et al. | |
| 2018/0337131 A1 | 11/2018 | Tsuyutani et al. | |
| 2019/0148302 A1* | 5/2019 | Tseng | H01L 23/5386 |
| | | | 257/774 |
| 2019/0312003 A1* | 10/2019 | Takeuchi | H01L 21/6835 |
| 2019/0364660 A1 | 11/2019 | Sato et al. | |
| 2020/0006232 A1* | 1/2020 | Pietambaram | H01L 23/5384 |
| 2020/0083189 A1* | 3/2020 | Chen | H01L 21/565 |

FOREIGN PATENT DOCUMENTS

| | | |
|---|---|---|
| JP | 2017157681 A | 9/2017 |
| JP | 2018133363 A | 8/2018 |
| WO | WO-2010/041630 A1 | 4/2010 |
| WO | WO-2018/150724 A1 | 8/2018 |
| WO | 2018180628 A1 | 10/2018 |

* cited by examiner

FIG. 7K

# EMBEDDED COMPONENT PACKAGE STRUCTURE AND MANUFACTURING METHOD THEREOF

BACKGROUND OF THE INVENTION

Field of the Invention

The invention relates in general to a component package structure and a manufacturing method thereof, and more particularly to an embedded component package structure and a manufacturing method thereof.

Description of the Related Art

In a system-level package structure, a semiconductor embedded in substrate (SESUB) technology that embeds a semiconductor chip into a package substrate has advantages of reduced noise interference upon a package structure as well as reduced a size of product, and has thus become a focus of research and development of manufacturers in the field. To enhance the yield rate of production, it is necessary to fix an embedded component in a dielectric structure of a circuit substrate to facilitate electrical connection between patterned conductive layers and the embedded component in subsequent process.

However, when the embedded component is deformed due to warpage, the electrical pads on the warped surface will not be on the same heights, thereby increasing the difficulty of the process for manufacturing subsequent conductive vias and reducing the yield of the process.

SUMMARY OF THE INVENTION

It is therefore an object of the invention to provide an embedded component package structure and a manufacturing method thereof, which can avoid damage to the embedded component caused by the sandblasting process, and can improve the yield of the embedded component packaging process.

According to one embodiment of the invention, an embedded component package structure including a dielectric structure and a component is provided. The component is embedded in the dielectric structure and is provided with a plurality of conductive pillars. The conductive pillars are exposed from an upper surface of the dielectric structure and have a first thickness and a second thickness, respectively, and the first thickness is not equal to the second thickness.

According to another embodiment of the invention, an embedded component package structure including a dielectric structure and a component is provided. The component is embedded in the dielectric structure and is provided with a plurality of conductive pillars. Each of the conductive pillars has a center line, and the center lines have a first inclined angle and a second inclined angle with respect to a vertical line. The inclined angle is not equal to the second inclined angle.

According to an alternative embodiment of the invention, a method of manufacturing an embedded component package structure including the following steps is provided. A semiconductor chip is provided on a carrier. The semiconductor chip is provided with a plurality of conductive pillars. The semiconductor chip has a warpage such that the conductive pillars are located at different heights. A dielectric structure is provided on the carrier, the dielectric structure covering the semiconductor chip and the conductive pillars. A portion of the dielectric structure and a portion of the conductive pillars are removed.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Details are given in the non-limiting embodiments below. It should be noted that the embodiments are illustrative examples and are not to be construed as limitations to the claimed scope of the present invention. The same/similar denotations are used to represent the same/similar components in the description below. Directional terms such as above, below, left, right, front or back are used in the following embodiments to indicate the directions of the accompanying drawings, not for limiting the present invention.

Figure 1A:
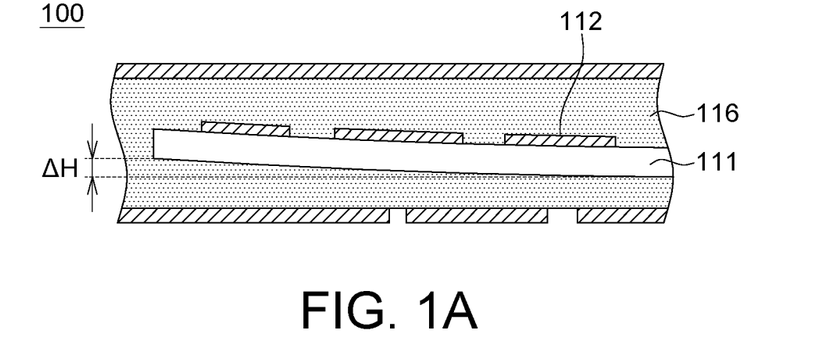
FIGS. 1A and 1B are partial schematic views showing a sandblasting process for the embedded component package structure.
Figure 1B:
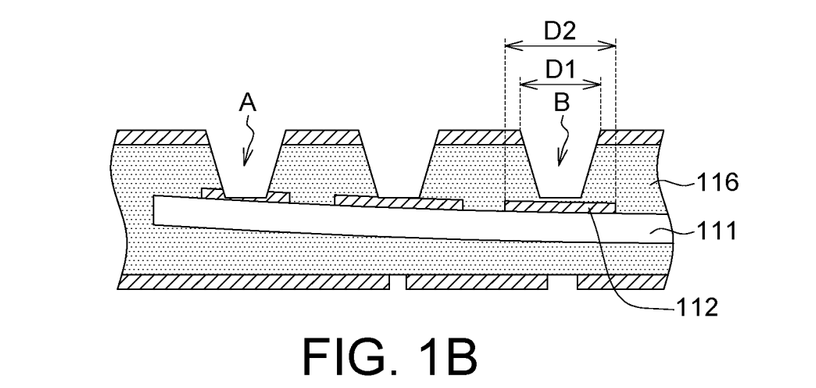

Please referring to FIGS. 1A and 1B, which show a partial schematic view of a sandblasting process for the embedded component package structure 100. First, a component 111 is provided and the component 111 is embedded in a dielectric structure 116. The upper surface of the embedded component 111 is provided with a plurality of electrical pads 112, for example. The material of the dielectric structure 116 is, for example, a resin that is curable by heat to fix the component 111 in the dielectric structure 116. However, when the amount of warpage ΔH of the embedded component 111 is greater than 15 μm, it will be disadvantageous for the sandblasting process to form blind vias because the distances between the electrical pads 112 on the warped surface and the upper surface of the dielectric structure 116 are different, that is, the electrical pads 112 are not on the same plane, As shown in FIG. 1B, one of the blind vias in part A is over-blasted to cause damage to the embedded component 111, and another one of the blind vias in part B does not form a blind via of sufficient depth due to insufficient sandblasting. Therefore, how to perform the subsequent embedded component packaging process when the embedded component 111 is warped or inclined (for example, the amount of warpage is more than 10 µm) is an important task to be solved urgently.

In addition, the minimum aperture D1 of the blind via formed by the conventional sand blasting process cannot be less than 40 µm, so that the minimum dimension D2 of the electrical pads 112 located under the blind via cannot be less than 60 µm, and thus the spacing between the electrical pads 112 cannot be reduced accordingly.

According to an embodiment of the present invention, an embedded component package structure is provided, which does not need to form blind vias by a sandblasting process, thereby preventing the problem that the depth of subsequent blind vias is over-blasted or insufficient due to the warpage of the embedded component (e.g., a semiconductor chip).

Figure 2:
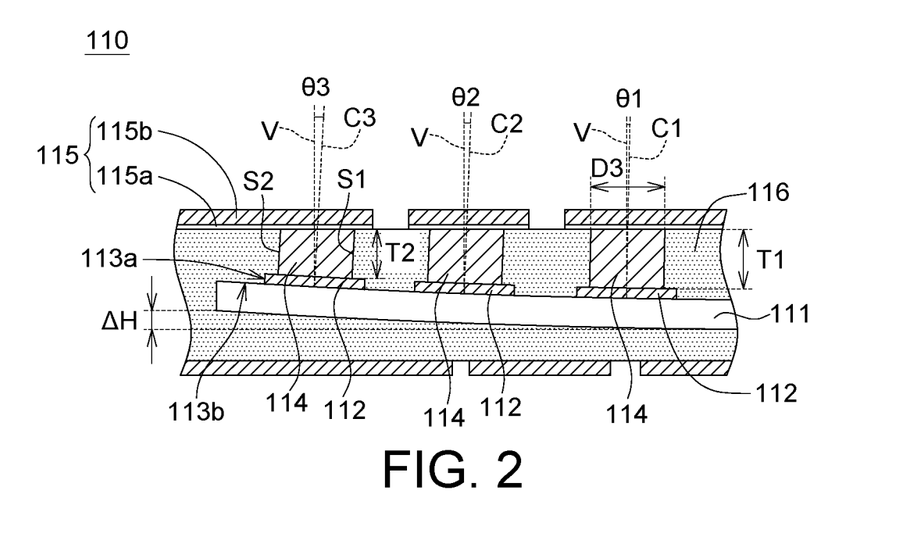
FIG. 2 is a partial cross-sectional view showing an embedded component package structure according to an embodiment of the invention, wherein the embedded component has a warpage.

Referring to FIG. 2, the embedded component package structure 110 includes a component 111 and a dielectric structure 116. The component 111 is embedded in the dielectric structure 116 and provided with a plurality of conductive pillars 114. The conductive pillars 114 are exposed from an upper surface of the dielectric structure 116 and have a first thickness T1 and a second thickness T2, respectively. The first thickness T1 is not equal to the second thickness T2. In an embodiment, the first thickness T1 may be greater than the second thickness T2. In another embodiment, the first thickness T1 may be smaller than the second thickness T2.

In an embodiment, the difference between the first thickness T1 and the second thickness T2 is used to compensate for the height difference (ΔH) generated by the warpage of the component 111, that is, the difference between the first thickness T1 and the second thickness T2 is substantially equal to the height difference (ΔH) between the highest and lowest points of the component 111, as shown in FIG. 2.

In an embodiment, the first thickness T1 differs from the second thickness T2 by at least 10 µm, such as between about 10 µm and 25 µm. Also, the amount of warpage ΔH of the component 111 is, for example, between 10 µm and 25 µm. In addition, the original thickness (indicated by T in FIG. 3A) of the conductive pillars 114 can be set as the sum of the amount of warpage ΔH of the component 111 and the minimum thickness of the conductive pillars 114 after grinding. For example, when the amount of warpage of the component 111 is 20 µm, the original thickness T of the conductive pillar 114 can be set to 28 µm.

In an embodiment, the minimum thickness of the conductive pillar 114 after grinding is at least greater than 3 µm, that is, the first thickness T1 and the second thickness T2 are at least greater than 3 µm to avoid grinding to the surface of the component 111 and damaging the component 111. In addition, in order to further consider the tolerance of the grinding process (for example, ±5 µm), the final thickness of the conductive pillar 114 should be greater than or equal to the sum of the tolerance of the grinding process and the minimum thickness of the conductive pillar 114 after grinding, that is, the first thickness T1 and the second thickness T2 is at least greater than or equal to 8 µm.

Referring to FIG. 2, each of the conductive pillars 114 has a first side S1 and a second side S2, wherein the length of the first side S1 is not equal to the length of the second side S2. That is, the length of the first side S1 of the conductive pillar 114 after the grinding may be greater than the length of the second side S2 after the grinding due to the warpage or inclining of the component 111. As seen from the vertical line V depicted in FIG. 2, the first side S1 and the second side S2 are located on opposite sides of the vertical line V, wherein the first side S1 is on the side where the amount of warpage is smaller with respect to the second side S2 and the second side S2 is relatively located on the side where the amount of warpage is larger.

In addition, referring to FIG. 2, each of the conductive pillars 114 have a center line C1-C3, and the center lines C1-C3 have at least a first inclined angle 81 and a second inclined angle 82 with respect to the vertical line V. The first inclined angle 81 is not equal to the second inclined angle 82. That is, the lower surfaces of the conductive pillars 114 are located at levels of different heights due to the warpage or inclining of the component 111, and each of the conductive pillars 114 has a different inclined angle, for example, the first inclined angle 81 is smaller than the second inclined angle 82. In addition, the outermost conductive pillar 114 has, for example, a third inclined angle 83 greater than the first inclined angle 81 and the second inclined angle 82, and the amplitudes of the first inclined angle 81 to the third inclined angle 83 are increased, for example, from the center of the component 111 to the opposite sides thereof, and the range of inclined angles 81 to 83 is, for example, between 1 and 10 degrees.

However, in another embodiment, when both opposite sides of the component 111 are bent downward with respect to the center instead of being bent upward, the length of the first side S1 of each of the conductive pillars 114 may be smaller than the length of the second side S2 in FIG. 2, and the first thickness T1 may be smaller than the second thickness T2. The present invention is not limited thereto.

Referring to FIG. 2, the embedded component package structure 110 further includes a conductive layer 115 covering the dielectric structure 116 and electrically connected to the conductive pillars 114. The conductive layer 115 includes, for example, an electroless plated seed layer 115a and an electroplated copper layer 115b. The conductive layer 115 can be processed through a lithography process to form a patterned circuit layer. In the present embodiment, the conductive pillars 114 are used to replace the conventional conductive vias, and the minimum dimension D3 (i.e., diameter) of the conductive pillars 114 can be reduced to less than 30 µm, so that the minimum dimension of the electrical pads 112 under the conductive pillars 114 can also be reduced to less than 50 µm, thereby further reducing the spacing between the electrical pads 112, such as less than 80 µm.

In an embodiment, the electrical pads 112 may be aluminum pads, and the conductive pillars 114 may be directly formed on the aluminum pads, or the electrical pads 112 may be a pad portion of a redistribution layer. Before forming the conductive pillars 114, a redistribution layer 113a may be formed on an insulating layer 113b (for example, oxynitride) on the surface of the component 111, and the conductive pillars 114 may be respectively disposed on the electrical pads 112 of the redistribution layer 113a. The present invention is not limited thereto.

Figure 3A:
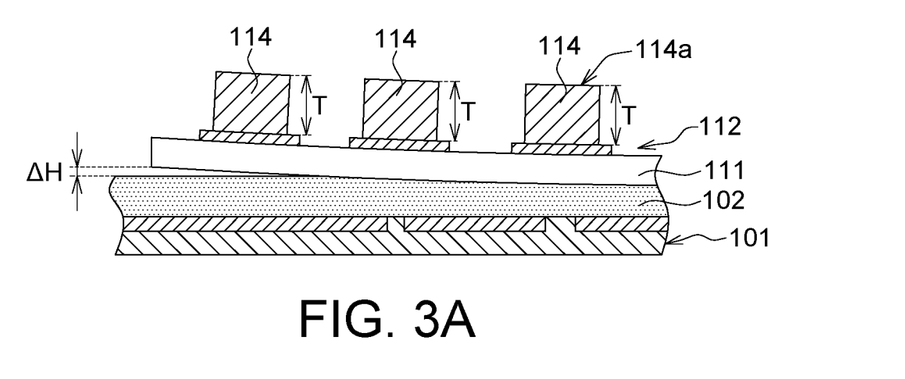
FIGS. 3A to 3E are flow diagrams showing a manufacturing method of an embedded component package structure according to an embodiment of the present invention.

Referring to FIGS. 3A to 3E, flow diagrams of a manufacturing method of the embedded component package structure 110 according to an embodiment of the present invention are shown. In FIG. 3A, a component 111 (e.g., a semiconductor chip) is provided on a carrier 101. The carrier 101 can be a metal substrate pre-formed with a dielectric material 102 thereon. The component 111 is provided with a plurality of conductive pillars 114, wherein the component 111 has an amount of warpage ΔH causing the conductive pillars 114 to be located at different heights. That is, the upper surfaces 114a of the conductive pillars 114 have different heights due to the warpage or inclining of the component 111. In order to make the upper surfaces 114a of the conductive pillars 114 having the same heights, the resin lamination and the grinding process are subsequently performed.

Figure 3B:
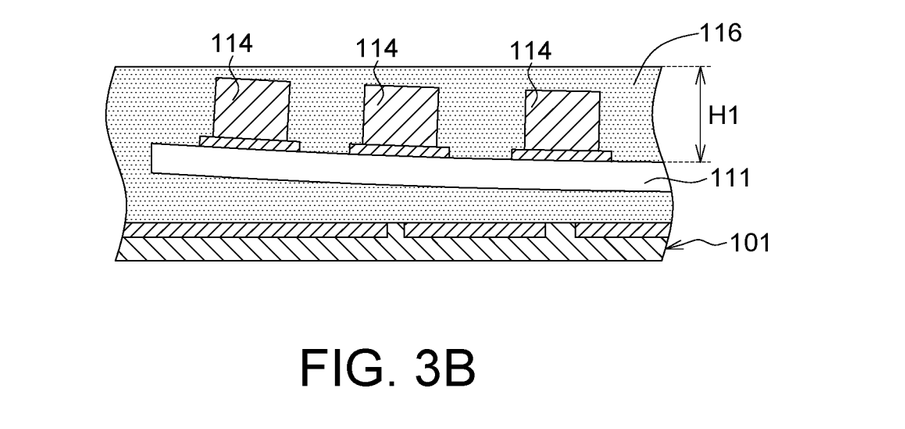
Figure 3C:
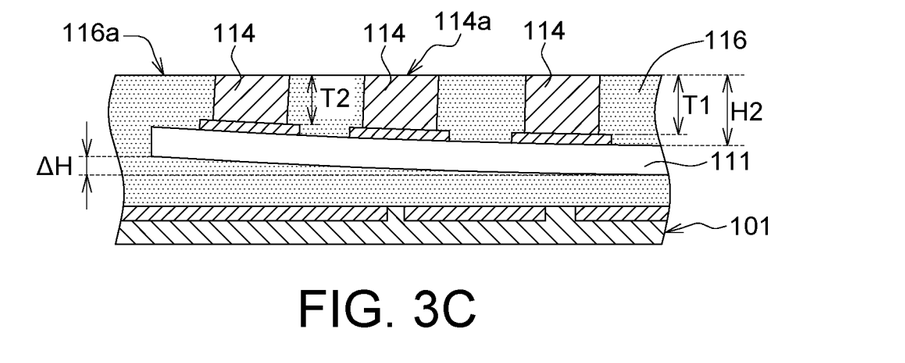

Referring to FIG. 3B, a dielectric structure 116 is provided on the carrier 101. The dielectric structure 116 covers the component 111 and the conductive pillars 114. The dielectric structure 116 may be pressed and coated on the component 111 by a semi-cured dielectric material (e.g., a resin) and cured by heat to form the dielectric structure 116. In order for the dielectric material to have good press-fit uniformity, the thickness H1 of the resin is, for example, greater than 12 μm. Referring to FIG. 3C, a portion of the dielectric structure 116 and a portion of the conductive pillars 114 are removed such that the upper surfaces 114a of the conductive pillars 114 and the upper surface 116a of the dielectric structure 116 have the same height (aligned with each other regardless of the tolerance of the grinding process). In the present embodiment, the difference in height between the dielectric structures 116 before and after grinding processes is at least greater than or equal to the amount of warpage of the component 111, i.e., H1−H2≥ΔH, such that the conductive pillars 114 are exposed from the upper surfaces 116a of the dielectric structure 116 and has different heights, that is, has a first thickness T1 and a second thickness T2, and the first thickness T1 is not equal to the second thickness T2. The amount of warpage ΔH of the component 111 is, for example, between 10 μm and 25 μm. However, under other controllable conditions, when the amount of warpage ΔH of the component 111 is greater than 25 μm, the present invention can be applied to improve the yield of the packaging process.

Figure 3D:
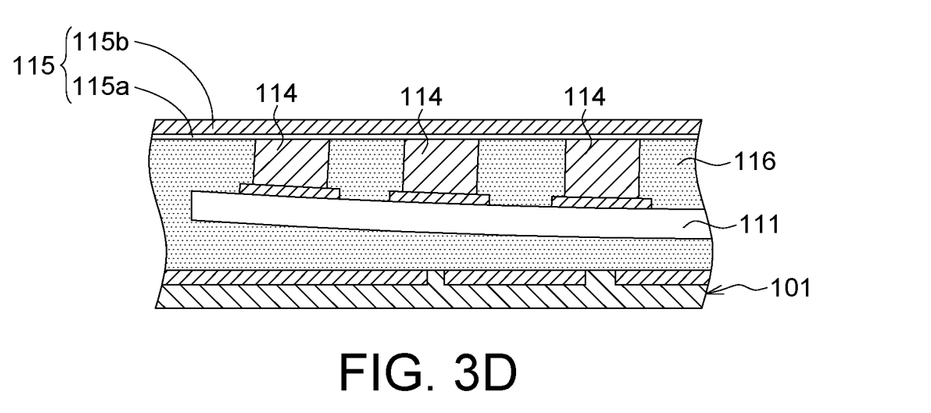
Figure 3E:
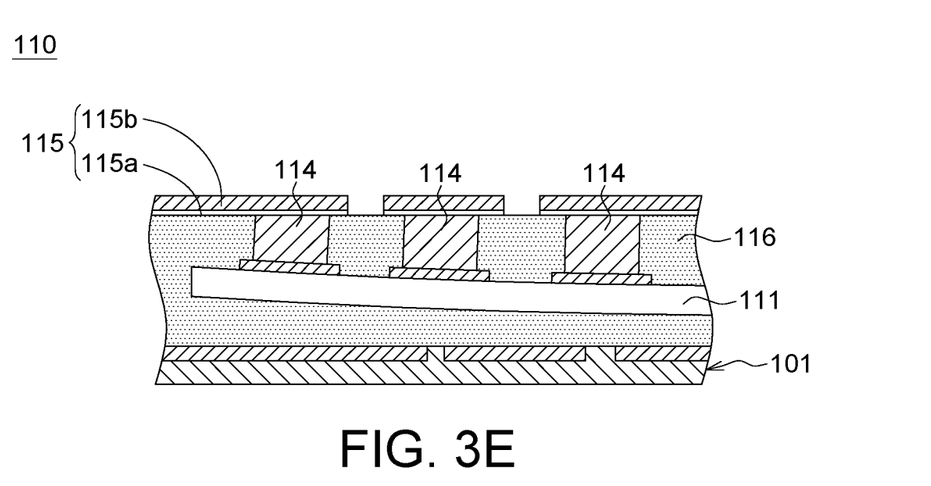
Figure 4A:
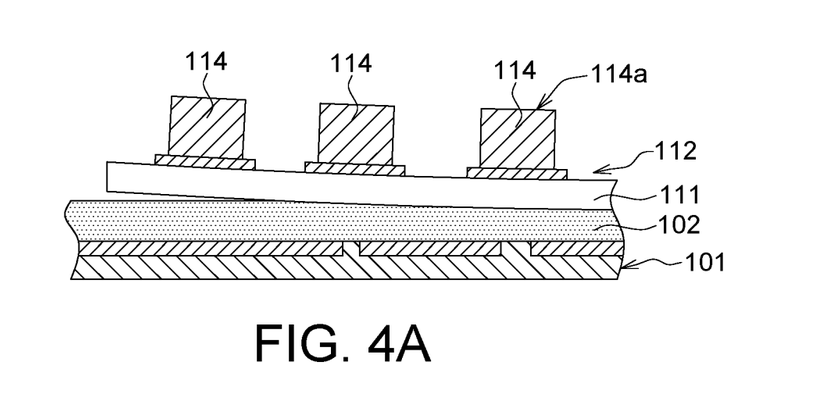
FIGS. 4A to 4E are flow diagrams showing a manufacturing method of an embedded component package structure according to another embodiment of the present invention.
Figure 4B:
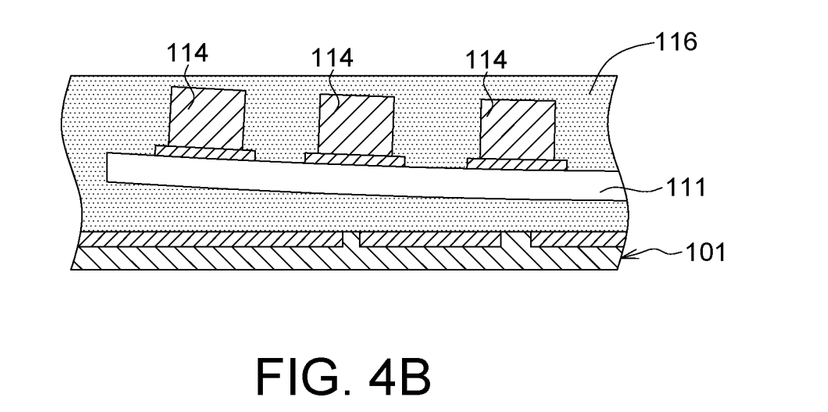
Figure 4C:
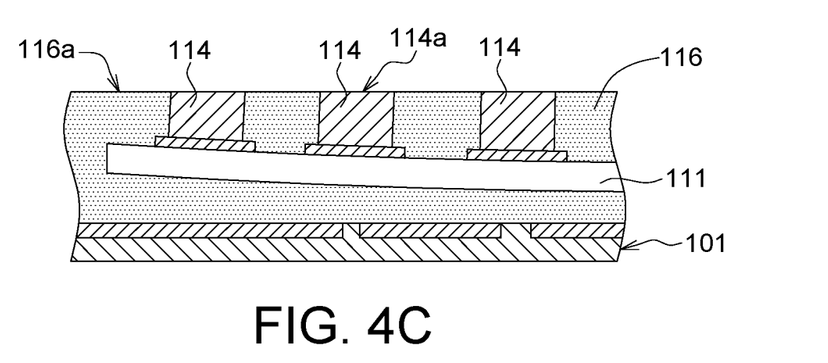
Figure 4D:
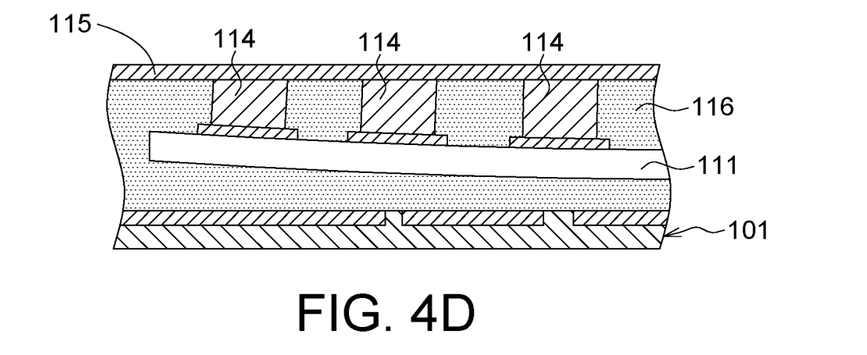
Figure 4E:
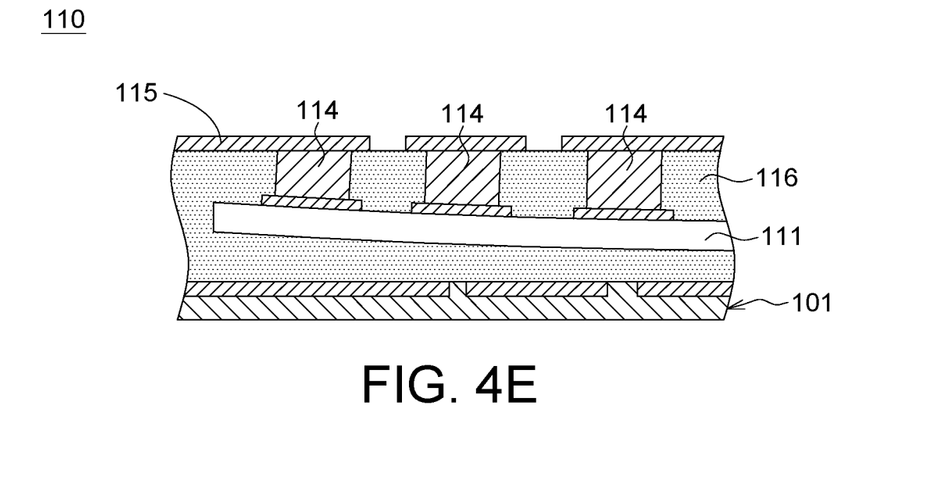
Figure 5A:
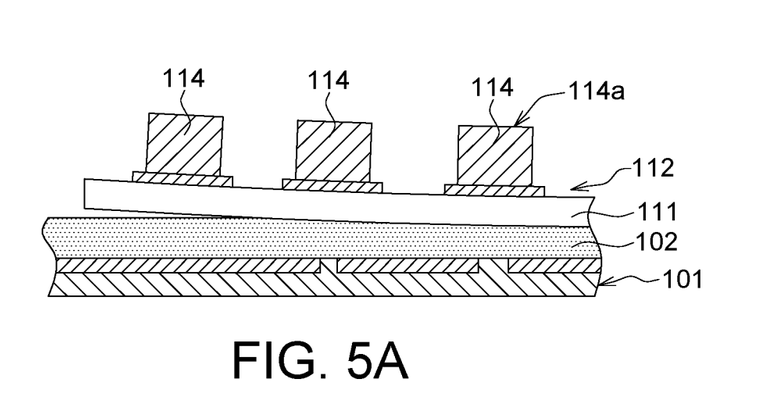
FIGS. 5A to 5F are flow diagrams showing a manufacturing method of an embedded component package structure according to another embodiment of the present invention.
Figure 5B:
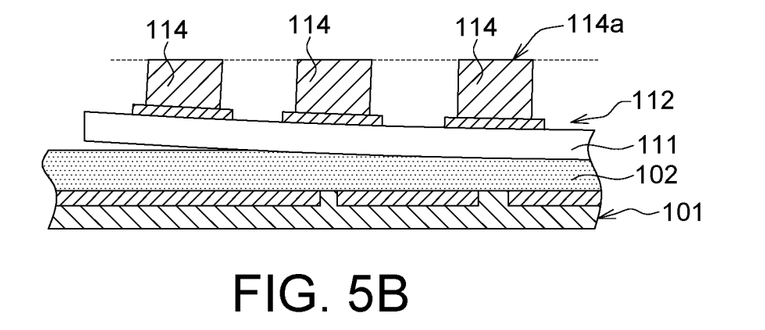
Figure 5C:
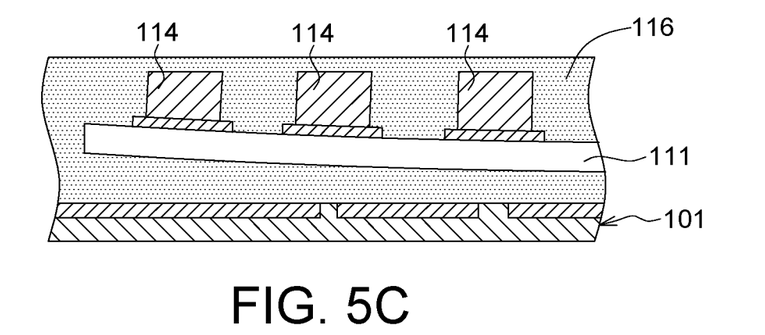
Figure 5D:
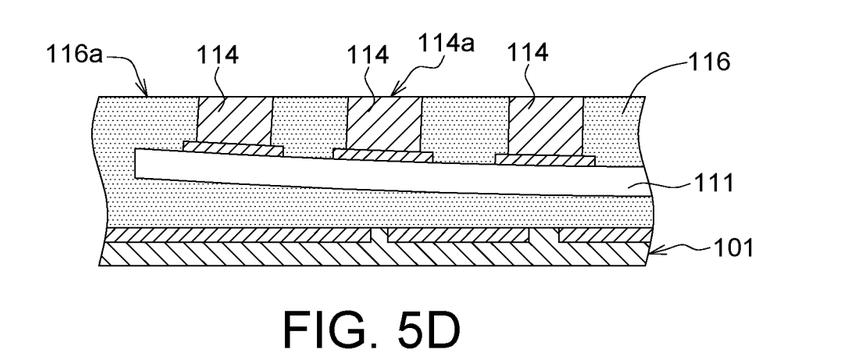
Figure 5E:
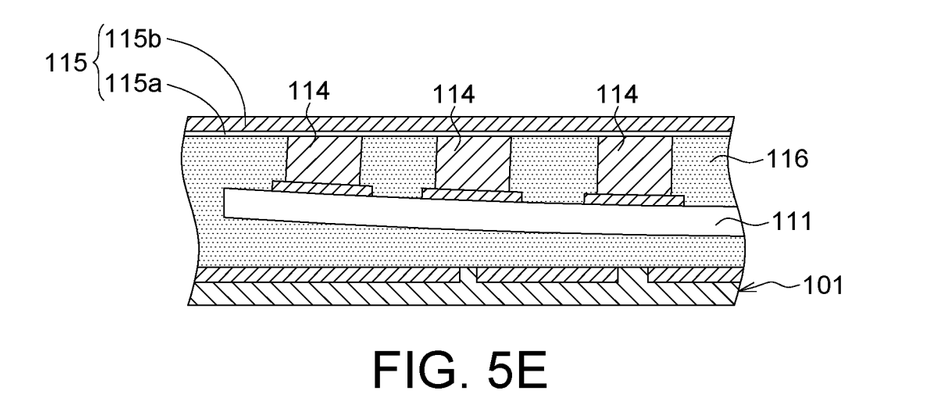
Figure 5F:
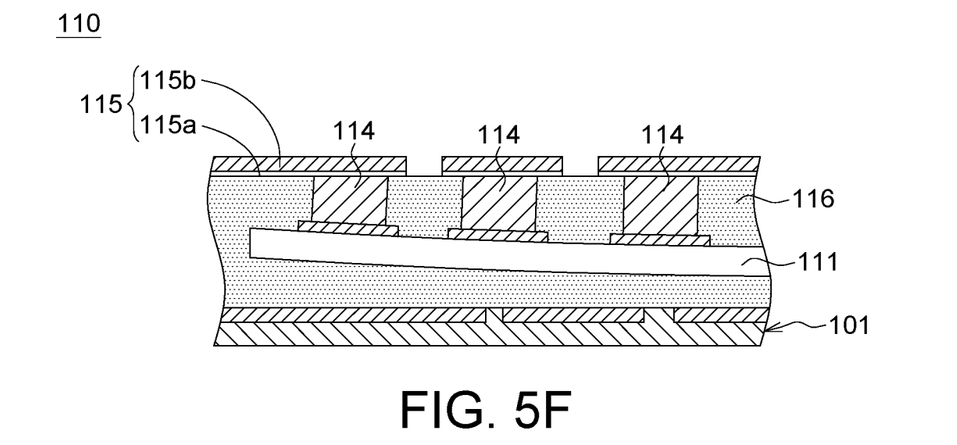

Referring to FIG. 3D, a conductive layer 115 is provided to cover the upper surface 116a of the dielectric structure 116, including forming an electroless plated seed layer 115a on the upper surface of the dielectric structure 116 and forming an electroplated copper layer. 115b on the seed layer 115a. The conductive layer 115 is electrically connected to the conductive pillars 114. Next, referring to FIG. 3E, a portion of the conductive layer 115 is etched to form a patterned conductive layer 115.

Referring to FIGS. 4A to 4E, flow diagrams of a manufacturing method of the embedded component package structure 110 according to another embodiment of the present invention are shown. This embodiment differs from the above embodiment in that, in FIG. 4D, a conductive layer 115 (e.g., a copper foil) is pressed onto the semi-cured dielectric structure 116, and the resin is cured by heat to fix the component 111 in the dielectric structure 116. Next, a portion of the conductive layer 115 is etched to form a patterned conductive layer 115. The remaining steps are as described in the above embodiments, and do not repeat herein again.

Referring to FIGS. 5A to 5F, flow diagrams of a manufacturing method of the embedded component package structure 110 according to another embodiment of the present invention are shown. This embodiment differs from the above two embodiments in that, in FIG. 5B, a portion of the conductive pillars 114 are first removed such that the upper surfaces 114a of the respective conductive pillars 114 have the same height. In this embodiment, the difference in height between the conductive pillars 114 before and after grinding is greater than or equal to the amount of warpage ΔH of the component 111, that is, the difference between the first thickness T1 and the second thickness T2 is almost equal to the amount of warpage ΔH of the component 111. Next, a dielectric structure 116 is provided on the carrier 101. The dielectric structure 116 covers the component 111 and the conductive pillars 114. A portion of the dielectric structure 116 is removed such that the conductive pillars 114 are exposed from the upper surface 116a of the dielectric structure 116. The remaining steps are as described in the above embodiments, and do not repeat herein again.

Figure 6A:
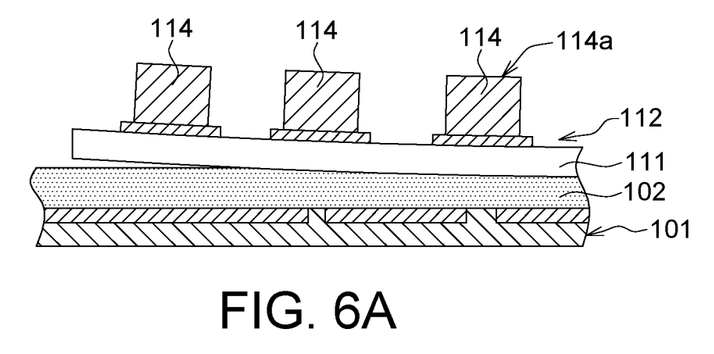
FIGS. 6A to 6F are flow diagrams showing a manufacturing method of an embedded component package structure according to another embodiment of the present invention.
Figure 6B:
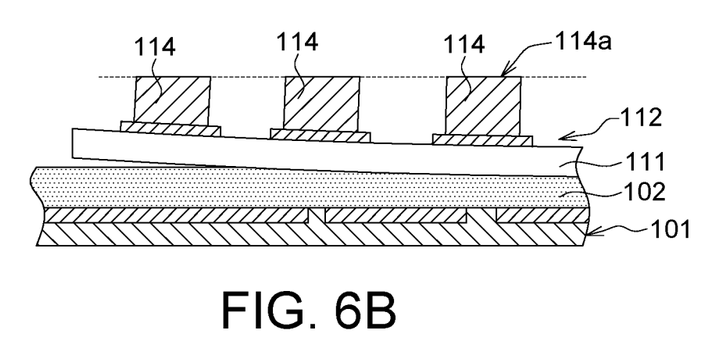
Figure 6C:
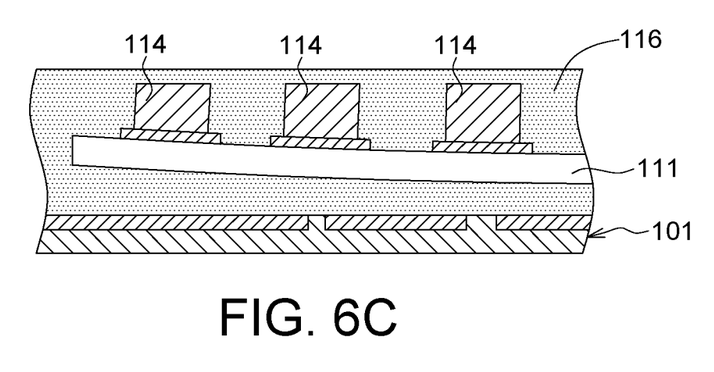
Figure 6D:
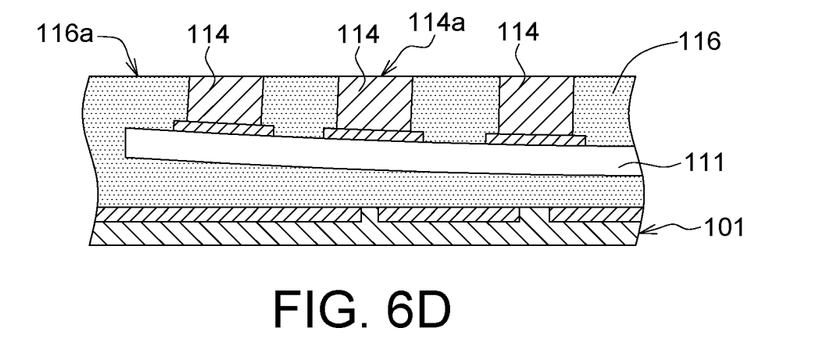
Figure 6E:
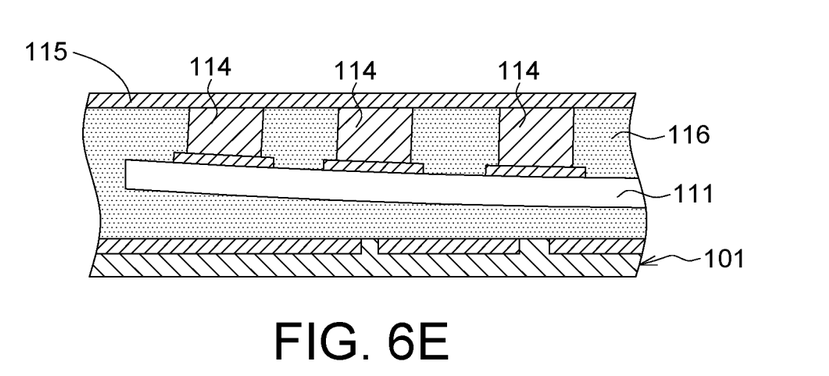
Figure 6F:
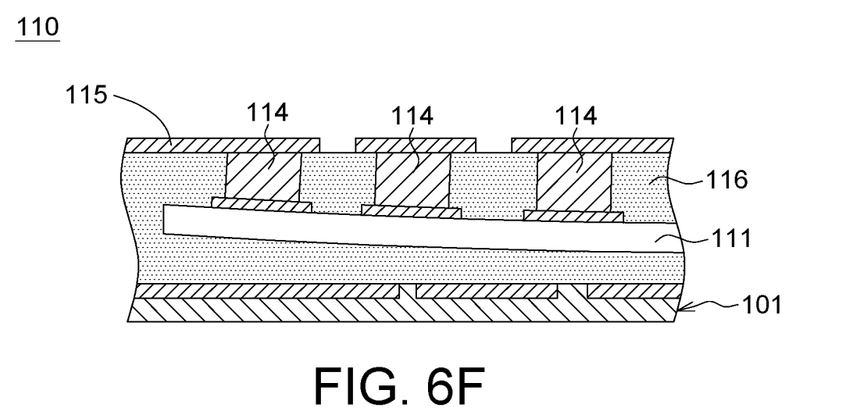

Referring to FIGS. 6A to 6F, flow diagrams of a manufacturing method of the embedded component package structure 110 according to another embodiment of the present invention are shown. As shown in FIG. 6B, a portion of the conductive pillars 114 are first removed such that the upper surfaces 114a of the respective conductive pillars 114 have the same height. Next, in FIG. 6E, a conductive layer 115 (e.g., a copper foil) is pressed onto the semi-cured dielectric structure 116, and the resin is cured by heat to fix the component 111 in the dielectric structure 116. The remaining steps are as described in the above embodiments, and do not repeat herein again.

Figure 7A:
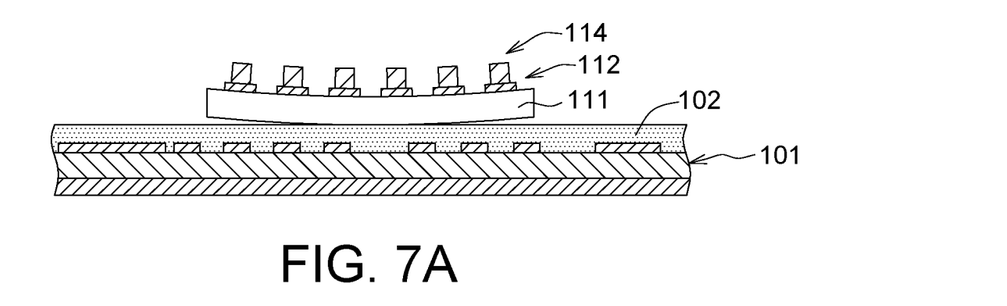
FIGS. 7A to 7K are flow diagrams showing a manufacturing method of an embedded component package structure according to another embodiment of the present invention.
Figure 7B:
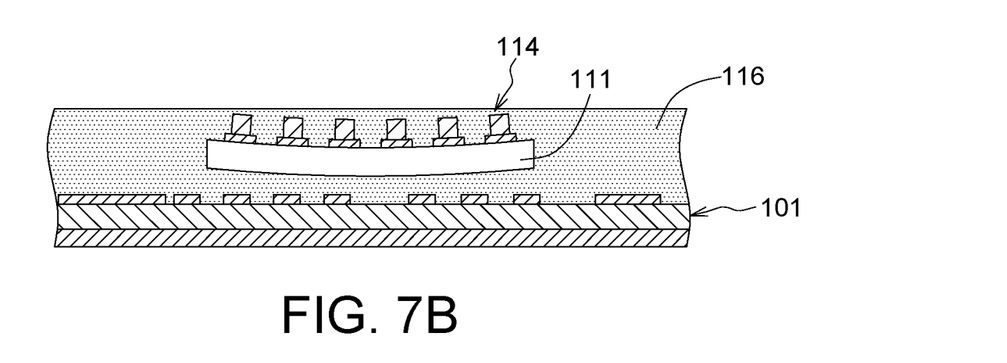
Figure 7C:
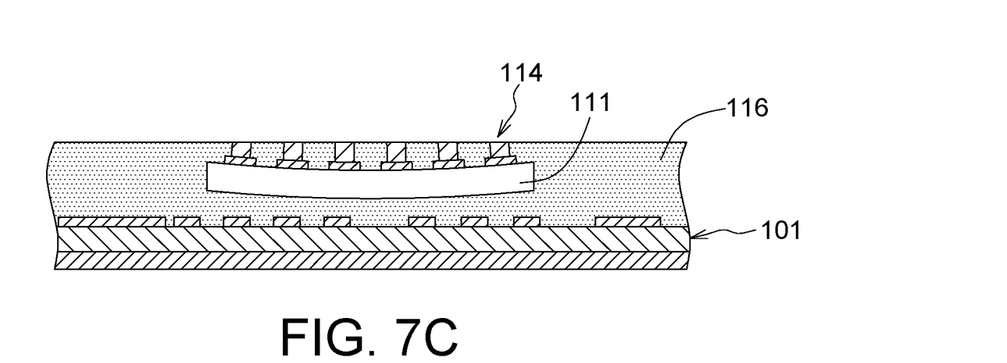
Figure 7D:
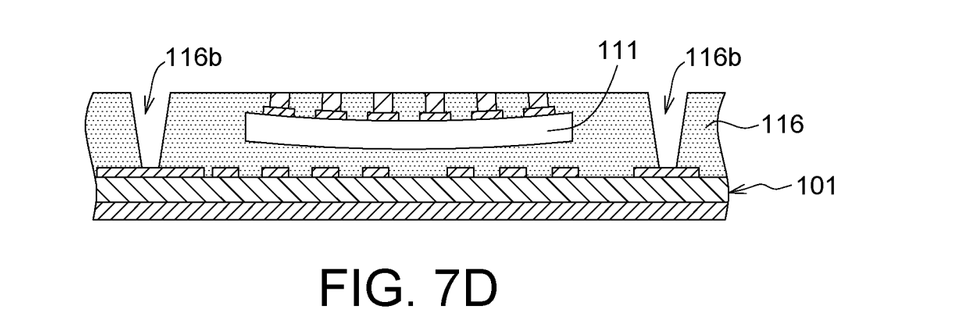
Figure 7E:
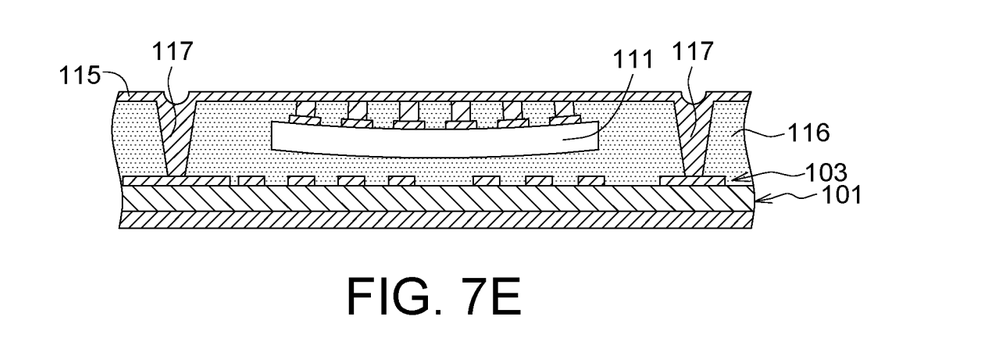
Figure 7F:
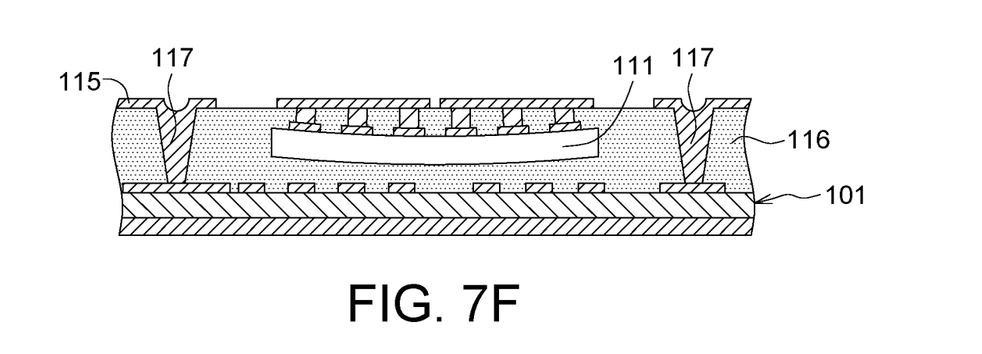
Figure 7G:
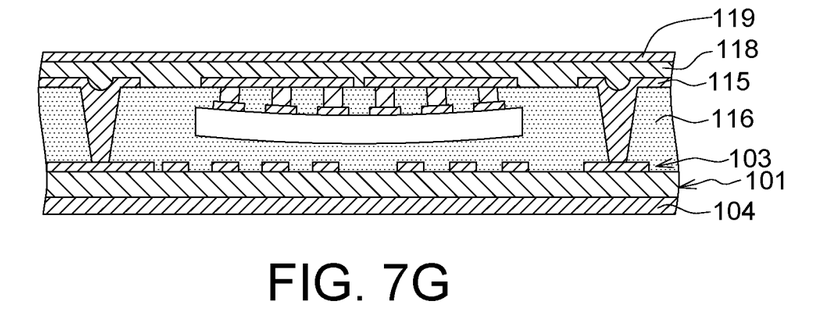
Figure 7H:
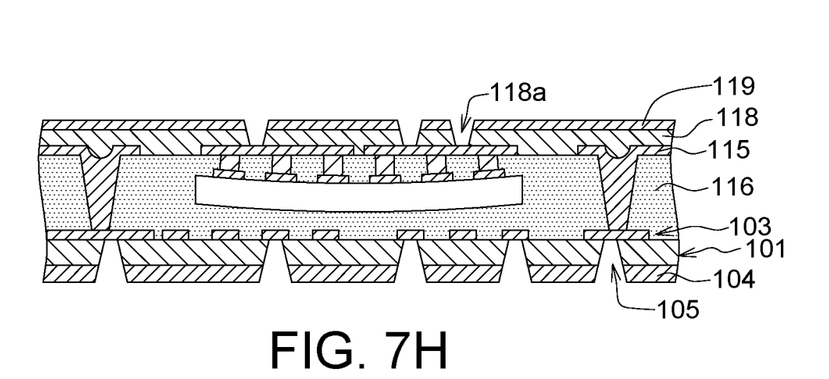
Figure 7I:
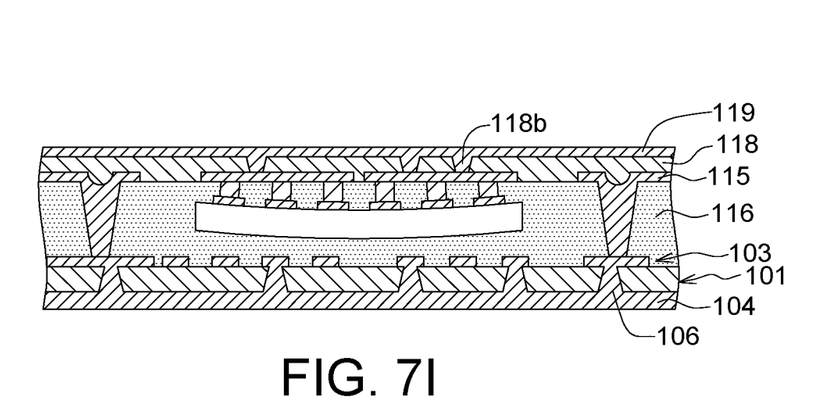

Referring to FIGS. 7A to 7K, flow diagrams of a manufacturing method of the embedded component package structure 110 according to another embodiment of the present invention are shown. The steps of FIGS. 7A to 7C have been mentioned in the above embodiments for providing a component 111 (e.g., a semiconductor chip) on a carrier 101, covering the component 111 and the conductive pillars 114 with a dielectric structure 116, and removing a portion of the dielectric structure 116 and a portion of the conductive pillars 114. In FIG. 7D, at least one blind via 116b is formed in the dielectric structure 116 by sandblasting or etching process. Next, in FIG. 7E, an upper conductive layer 115 is formed on the upper surface of the dielectric structure 116, and the upper conductive layer 115 extends into the blind via 116b to form a conductive via 117 electrically connected to the lower conductive layer 103. In FIG. 7F, a patterned upper conductive layer 115 is formed. Next, in FIG. 7G, a dielectric layer 118 (e.g., a glass-containing resin) is formed on the dielectric structure 116, and another upper conductive layer 119 (e.g., a copper foil) is pressed on the dielectric layer 118, and the resin is cured by heat to laminate the two upper conductive layers 115 and 119. In FIG. 7H, a plurality of blind vias 118a are formed in the dielectric layer 118. Next, in FIG. 7I, an electroless plated seed layer is formed on the upper surface of the upper conductive layer 119 and in the blind vias 119a, and then an electroplated copper layer is formed on the seed layer to electrically connect the two upper conductive layers 115 and 119 via the conductive vias 118b. In addition, in FIG. 7H, the carrier 101 may further include another lower conductive layer 104, forming a patterned lower conductive layer 104 by etching and forming a plurality of blind vias 105 in the carrier 101 by sandblasting are provided, and then, In FIG. 7I, an electroless plated seed layer is formed on the lower conductive layer 104 and in the blind via 105, and an electroplated copper layer is formed on the seed layer to electrically connect the two lower conductive layers 103 and 104 via the conductive vias 106.

Figure 7J:
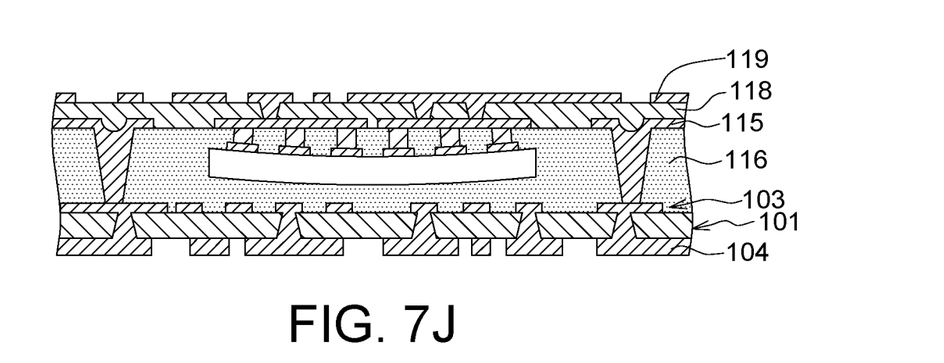
Figure 7K:
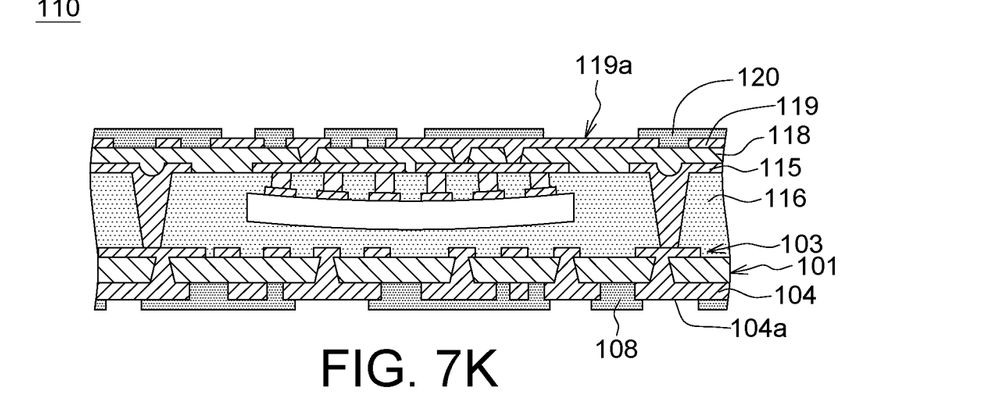

In FIG. 7J, a patterned upper conductive layer 119 and a patterned lower conductive layer 104 are formed, and then, in FIG. 7K, a patterned first solder mask layer 120 is formed on the patterned upper conductive layer 119 and a portion of the upper conductive layer 119 is exposed from the first solder mask layer 120 as a plurality of first bonding pads 119a; and a patterned second solder mask layer 108 is formed on the patterned lower conductive layer 104 and a portion of the lower conductive layer 104 is exposed from the second solder mask layer 108 as a plurality of second bonding pads 104a.

In the present embodiment, since the conductive pillars 114 having unequal heights are formed in advance on the semiconductor chip, conventional blind vias are not required to be formed by the sandblasting process, thereby avoiding the problem that the depth of subsequent blind vias is over-blasted or insufficient due to the warpage of the embedded component (e.g., a semiconductor chip). At the same time, the upper surfaces of the conductive pillars 114 have the same height after grinding, thereby facilitating the subsequent resin lamination process and the perforation process, and improving the yield of manufacturing the conductive layers and the conductive vias.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An embedded component package structure, comprising:
   a dielectric structure; and
   an component embedded in the dielectric structure, wherein the component is provided with a plurality of conductive pillars, the conductive pillars being exposed from an upper surface of the dielectric structure and each conductive pillar having a first height and a second height respectively, wherein the first height is not equal to the second height.

2. The package structure according to claim 1, wherein the component has a warpage between 10-25 μm.

3. The package structure according to claim 1, wherein the component is provided with a redistribution layer and an insulation layer, the redistribution layer is disposed on the insulation layer, and the redistribution layer has a plurality of electrical pads on which the conductive pillars are disposed.

4. The package structure according to claim 1, wherein the first height differs from the second height by at least 10 μm.

5. The package structure according to claim 1, wherein the first height and the second height are at least greater than 3 μm.

6. The package structure according to claim 1, wherein upper surfaces of the conductive pillars are aligned with the upper surface of the dielectric structure, and lower surfaces of the conductive pillars are located on levels of different heights.

7. The package structure according to claim 1, wherein the conductive pillars have a first side and a second side, and a length of the first side is not equal to a length of the second side.

8. The package structure according to claim 1, further comprising a conductive layer covering the dielectric structure and electrically connected to the conductive pillars.

9. The package structure according to claim 1, wherein each of the conductive pillars has a center line, the center lines have a first inclined angle and a second inclined angle with respect to a vertical line, and the first inclined angle is not equal to the second inclined angle.

10. An embedded component package structure, comprising:
    a dielectric structure; and
    a component embedded in the dielectric structure, wherein the component is provided with a plurality of conductive pillars, wherein each of the conductive pillars has a center line, the center lines have a first inclined angle and a second inclined angle with respect to a vertical line, and the first inclined angle is not equal to the second inclined angle.

11. The package structure according to claim 10, wherein the component has a warpage between 10-25 μm.

12. The package structure according to claim 10, wherein the component is provided with a redistribution layer and an insulation layer, the redistribution layer is disposed on the insulation layer, and the redistribution layer has a plurality of electrical pads disposed on the electrical pads.

13. The package structure according to claim 10, wherein upper surfaces of the conductive pillars are aligned with an upper surface of the dielectric structure, and lower surfaces of the conductive pillars are located on levels of different heights.

14. The package structure according to claim 13, wherein the conductive pillars are exposed from the upper surface of the dielectric structure and each conductive pillar has a first height and a second height respectively, and the first height is not equal to the second height.

15. The package structure according to claim 14, wherein the first height differs from the second height by at least 10 μm.

16. The package structure according to claim 14, wherein the first height and the second height are at least greater than 3 μm.

17. The package structure according to claim 10, wherein the conductive pillars have a first side and a second side, a length of the first side is not equal to a length of the second side.

18. The package structure according to claim 10, further comprising a conductive layer covering the dielectric structure and electrically connected to the conductive pillars.

19. The package structure according to claim 1, wherein at least one of the plurality of conductive pillars has a lateral surface in direct contact with the dielectric structure.

20. The package structure according to claim 1, wherein at least one of the plurality of conductive pillars has a uniform width measured in a direction substantially parallel to the upper surface of the dielectric structure.

* * * * *